United States Patent
Kale et al.

(10) Patent No.: US 11,417,373 B2
(45) Date of Patent: Aug. 16, 2022

(54) NEUROMORPHIC COMPUTING DEVICES AND METHODS

(71) Applicant: Micron Technology, Inc., Boise, ID (US)

(72) Inventors: Poorna Kale, Folsom, CA (US); Amit Gattani, Granite Bay, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/116,759

(22) Filed: Dec. 9, 2020

(65) Prior Publication Data

US 2022/0180907 A1   Jun. 9, 2022

(51) Int. Cl.
*G11C 7/10* (2006.01)
*G06N 3/08* (2006.01)
*G06F 7/544* (2006.01)
*G06F 17/16* (2006.01)

(52) U.S. Cl.
CPC .......... *G11C 7/1075* (2013.01); *G06F 7/5443* (2013.01); *G06F 17/16* (2013.01); *G06N 3/08* (2013.01); *G11C 7/1084* (2013.01); *G11C 7/1096* (2013.01)

(58) Field of Classification Search
CPC ... G11C 7/1075; G11C 7/1084; G11C 7/1096; G11C 11/54; G06F 7/5443; G06F 17/16; G06F 2207/4824; G06N 3/08; G06N 3/02; G06N 3/06; G06N 3/04
See application file for complete search history.

(56) References Cited

U.S. PATENT DOCUMENTS

| | | | |
|---|---|---|---|
| 5,901,301 A | 5/1999 | Matsuo et al. | |
| 6,877,071 B2 | 4/2005 | Sherman | |
| 9,971,540 B2 | 5/2018 | Herrero Abellanas et al. | |
| 2014/0082328 A1 | 3/2014 | Gopal et al. | |
| 2018/0061242 A1* | 3/2018 | Bavar | G01C 21/3407 |
| 2018/0253636 A1* | 9/2018 | Lee | G06N 3/063 |
| 2019/0235462 A1 | 8/2019 | Cella et al. | |
| 2019/0265714 A1 | 8/2019 | Ball et al. | |
| 2019/0392297 A1 | 12/2019 | Lau et al. | |
| 2020/0218981 A1 | 7/2020 | Ross et al. | |
| 2020/0349216 A1* | 11/2020 | Das Sarma | G06F 7/49915 |

OTHER PUBLICATIONS

International Search Report and Written Opinion from related PCT Application No. PCT/US2021/060957, dated Mar. 30, 2022, 10 pages.

* cited by examiner

*Primary Examiner* — Ajay Ojha
(74) *Attorney, Agent, or Firm* — Brooks, Cameron & Huebsch, PLLC

(57) ABSTRACT

A dual-port, dual function memory device can be configured to perform operations on data written to the memory device using artificial intelligence (AI) circuitry, such as a neuromorphic array and/or a deep learning accelerator (DLA), of the memory device. The memory device can include a port dedicated for communication between the AI circuitry and a host device and another port dedicated for communication between a memory array of the memory device and a host device. Performing operations, such as image processing operations, using AI circuitry of a memory device can reduce data transfers, reduce resource consumption, and offload workloads from a host device.

24 Claims, 8 Drawing Sheets

NEUROMORPHIC COMPUTING DEVICES AND METHODS

TECHNICAL FIELD

The present disclosure relates generally to memory devices, and more particularly, to apparatuses and methods related to a dual-port, dual-function memory device.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
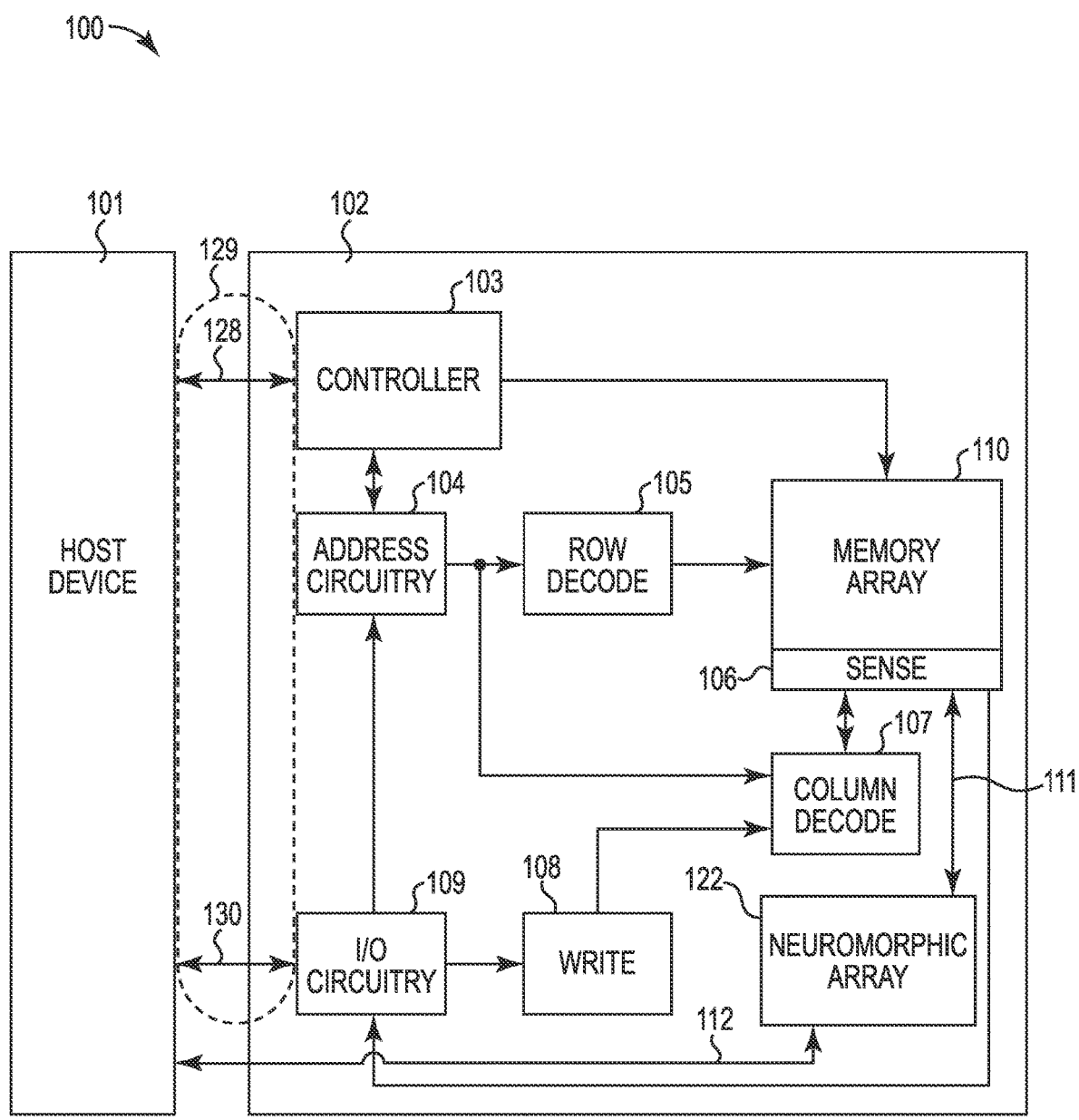
FIG. 1 is a block diagram of an apparatus in the form of a system including a dual-port, dual-function memory device including a neuromorphic array in accordance with a number of embodiments of the present disclosure.

The present disclosure includes apparatuses and methods related to a dual-port, dual-function memory device. In some previous approaches, data from an imaging device may be communicated to a host device, such a central processing unit (CPU), for pre-processing before being written to a memory device. Data from an imaging device may be written to a memory device and subsequently communicated from the memory device to a host device for pre-processing. The pre-processed data may be written to the memory device.

Some previous approaches may include multiple data transfers. As described above, there may be a data transfer from an imaging device to a host device and/or a memory device for each set of data communicated from the imaging device. There may be data transfers from a memory device to a host processing device, or vice versa, for each set of data communicated from the imaging device. Each data transfer may include multiple operations. For example, a data transfer may include one or more read operations, one or more decompression operations, and/or one or more compression operations. The data transfers, and their associated operations, may increase the consumption of resources (e.g., power, time, etc.) of a system including an imaging device, a host processing device, and a memory array.

At least one embodiment of the present disclosure addresses these shortcomings and other issues associated with some previous approaches, by enabling a memory device to store data communicated from an imaging device and to perform one or more operations on data written to the memory device using artificial intelligence (AI) circuitry of the memory device. Examples of AI circuitry include, but are not limited to, a neuromorphic array and a deep learning accelerator (DLA). As used herein, AI refers to an ability of an apparatus and/or system to make decisions based on results from past decisions. AI capable devices can be configured to store patterns and/or examples that can be utilized at a later time to take actions. Deep learning refers to an ability of a device to learn from data provided as examples. Deep learning can be a subset of AI. Neural networks, among other types of networks, can be classified as deep learning. The low power, inexpensive design of DLAs can be implemented in internet-of-things (TOT) devices, among other types of devices.

Inexpensive and energy-efficient AI accelerators, such as DLAs, can be implemented on an edge of a memory device. As used herein, an edge of a memory device can refer to an area of the memory device other than an area of the memory device occupied by the memory array and/or the sensing circuitry. For example, an edge of the memory device can refer to an output and/or input path of a memory device, where the output path and/or the input path is used to transfer data to and/or from a memory array of the memory device. A DLA implemented on an edge of a memory device can be referred to as an "edge DLA." Memory devices including edge DLAs can be deployed at remote locations without requiring cloud or offloading capability. Improving latency, power consumption, and/or throughput of a DLA can improve latency, power consumption, and/or throughput of a memory device including the DLA.

Neuromorphic computing architectures can include hardware and/or software configured to mimic neuro-biological architectures present in a biological nervous system. Neuromorphic computing architectures can include a multilayer neuron architecture referred to as a perceptron. A neuron in a multilayered neuron architecture can be referred to as an artificial neuron. An artificial neuron can combine one or more inputs received to produce an output. For example, an artificial neuron can include circuitry configured to mimic and/or perform one or more functions of a biological neuron. Outputs of a first artificial neuron can be propagated to a second artificial neuron utilizing an artificial synapse.

At least one embodiment of the present disclosure improves performance of an imaging system including a memory device and an imaging device coupled thereto because the memory device includes AI circuitry that is physically closer to the imaging device and/or a memory array of the memory device as compared to some previous approaches. By including AI circuitry on a memory device and coupled to a memory array of the memory device, the quantity of data transfers between the memory device and a host processing device and/or between the memory device and an imaging device coupled to the memory device are reduced. Reducing data transfers can enable an increased quantity of frames to be processed during a period of time (an increased rate, frames per second), for example, as compared to some previous approaches. Having AI circuitry physically closer to a memory array can enable a higher resolution image to processed as compared to some previous approaches.

Performing, by a memory device, image processing operations on data from an imaging device can offload workloads from a host device or a host processing device because, in some previous approaches, a host device or a host processing device may direct pre-processing of data. At least one embodiment can perform image processing operations using AI circuitry of a memory device with minimal, if any, interaction with an external source of instructions, such as a host processing device. For example, a host processing device may provide instructions, to the AI circuitry, indicative of image processing operations to be performed. However, the AI circuitry can perform those operations without further instruction from the host processing device. This can reduce the quantity of data transfers as compared to some previous approaches because the AI circuitry can receive (e.g., retrieve directly) data from a memory array of the memory device. Thus, at least one embodiment of the present disclosure can reduce resource consumption and/or resource requirements of an imaging system as compared to some previous approaches because fewer data transfers and operations associated therewith are needed.

At least one embodiment of the present disclosure can include receiving, from an imaging device via a first port of a memory device, data corresponding to an image captured by the imaging device. As used herein, a "port" of a memory device refers to a distinct physical and logical interface of the memory device. Unless indicated otherwise, the terms "port" and "interface" are used interchangeably herein. A port may include multiple physical connections such as pins. Examples of ports include serial ports (e.g., a camera serial interface operated according to a mobile industry processor interface (MIDI) protocol) and memory ports (e.g., a double data rate (DDR) interface). The first port can be dedicated for communication between an array of memory cells of the memory device and a host device. Instructions to perform an operation on the data can be received from a host device via a second port of the memory device. The second port can be dedicated for communication between a neuromorphic array of the memory device and the host device. The data can be written to a memory array (e.g., an array of memory cells) of the memory device. The data can be received (e.g., retrieved directly) by the neuromorphic array from the memory array. An operation can be performed, according to the instructions, on the data using the neuromorphic array.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 102 may reference element "102" in FIG. 1, and a similar element may be referenced as 202 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of an apparatus in the form of a system 100 including a dual-port, dual-function memory device 102 (hereinafter referred to as the memory device 102) including a neuromorphic array 122 in accordance with a number of embodiments of the present disclosure. As used herein, a memory device 102, a controller 103, a memory array 110, sensing circuitry 106, and/or a neuromorphic array 122 might also be separately considered an "apparatus."

The system 100 includes a host device 101 coupled to the memory device 102, which includes a memory array 110. Although not specifically illustrated as such, in at least one embodiment, the host device 101 can represent multiple distinct devices, such as an imaging device coupled to the memory device 102 as well as a host device coupled to the memory device 102. Examples of the host device 101 include a personal laptop computer, a desktop computer, a digital camera, a smart phone, a memory card reader, an image sensor, and ISP, or a vehicle (e.g., an autonomous vehicle), among various other types of peripheral devices. The host device 101 can include a system motherboard and/or backplane and can include a number of processing devices (e.g., one or more processors, microprocessors, or some other type of controlling circuitry). The system 100 can include separate integrated circuits or both the host device 101 and the memory device 102 can be on the same integrated circuit.

For clarity, the system 100 has been simplified to focus on features with particular relevance to the present disclosure. The memory array 110 can be a hybrid memory cube (HMC), DRAM array, static random access memory (SRAM) array, spin-transfer torque random access memory (STT RAM) array, PCRAM array, thyristor random access memory (TRAM) array, RRAM array, NAND flash array, and/or NOR flash array, for instance. In at least one embodiment, the memory array 110 can be a solid state drive (SSD).

The memory array 110 can comprise memory cells arranged in rows coupled by access lines, which may be referred to herein as word lines or select lines, and columns coupled by digit lines, which may be referred to herein as bit lines, data lines, or sense lines. Although a single memory array 110 is shown in FIG. 1, embodiments are not so limited. For instance, the memory device 102 may include a number of memory arrays 110 (e.g., a number of banks of DRAM cells, NAND flash cells, etc.).

The memory device 102 can include address circuitry 104 to latch address signals for data provided over an input/output "I/O" bus 130 (e.g., data bus and/or address bus) through I/O circuitry 109 (e.g., provided to external ALU circuitry and to DRAM DQs via local I/O lines and global I/O lines). Address signals are received through address circuitry 104 and decoded by a row decoder 105 and a column decoder 107 to access the memory array 110. Data can be read from the memory array 110 by sensing voltage and/or current changes on the digit lines using the sensing circuitry 106. The sensing circuitry 106 can read and latch a page (e.g., row) of data from the memory array 110. The I/O circuitry 109 can be used for bi-directional data communication with the host device 101 over the I/O bus 130. In a number of embodiments, sensing circuitry 106 can include a number of sense amplifiers and a respective number of compute components as will be discussed further herein. The write circuitry 108 can be used to write data to the memory array 110. The various components of memory device 102 may be implemented in a single device or package, or they may be implemented as one or more discrete components connected with wires, traces, interposers, wireless interfaces, or the like.

The controller 103 (e.g., memory controller) decodes signals provided by a control bus 128 from the host device 101. These signals can include chip enable signals, write enable signals, and address latch signals that are used to control operations performed on the memory array 110, including data read, data write, and data erase operations. In various embodiments, the controller 103 is responsible for executing instructions from the host device 101 and sequencing access to the memory array 110. The controller 103 can be a state machine, sequencer, or some other type of controller, and include hardware and/or firmware (e.g., microcode instructions) in the form of an application specific integrated circuit (ASIC). The controller 103 can control, for example, generation of clock signals and application of the clock signals to a compute component in sensing circuitry in association with shifting data.

The memory device 102 includes the neuromorphic array 122. As represented by the double-headed arrow 111, the neuromorphic array 122 can have direct access to the memory array 110. The double-headed arrow 111 can represent a high-bandwidth interface between the neuromorphic array 122 and the memory array 110. The high-bandwidth interface can include at least an I/O (data) bus, an address bus, and a control bus, for example, dedicated for communication between the memory device 110 and the neuromorphic array 122. A non-limiting example of an internal high-bandwidth interface can be a DRAM DDR interface. In at least one embodiment, the memory array 110 can be coupled to the neuromorphic array 122 such that the high-bandwidth interface is external, such as a peripheral component interconnect express (PCIe) interface. The neuromorphic array 122 can be configured to perform image processing operations on data received from the memory array 110 according to instructions received by the memory device 102. Non-limiting examples of image processing operations include a compression operation, a frame buffer operation, a color space conversion operation, an attention finding operation, and an encoding, decoding, or scaling operation.

As illustrated by FIG. 1, the memory device 102 can be a dual-port memory device. The control bus 128 and the I/O bus 130 can be referred to, collectively, as a port 129 of the memory device 102. The memory device 102 can include another port, port 112, dedicated for communication between the host device 101 and the neuromorphic array 122. Although the port 112 is illustrated more generically than the port 129, the port 112 can include, for example, a connection to the I/O circuitry 109 or other I/O circuitry (not specifically illustrated). The port 112 can include at least an I/O bus and a control bus, similar to the control bus 128 and the I/O bus 130, for example, dedicated for communication between the host device 101 and the neuromorphic array 122. For example, the port 112 can be used for communication of instructions from the host device 101 to the neuromorphic array 122 and/or communication of responses from the neuromorphic array 122 to the host device 101. The port 112 can be, but is not limited to, a MIPI, a PCIe interface, or a compute express link (CXL) interface, or a low-power double data rate interface, such as LPDDR59. In a number of embodiments, the port 112 can be a separate and distinct physical interface of the memory device 102. The host device 101 can communicate instructions to perform an image processing operation to the neuromorphic array 122 via the port 112. The neuromorphic array 122 can communicate completion of operations (e.g., image processing operations) performed by the neuromorphic array 122 to the host device 101 via the port 112. As described above, in at least one embodiment, the host device 101 represents more than one distinct device in which the port 129 represents an interface for a first host device (e.g., an imaging device) and the port 112 represents an interface for a second host device (e.g., a computing device).

Figure 2:
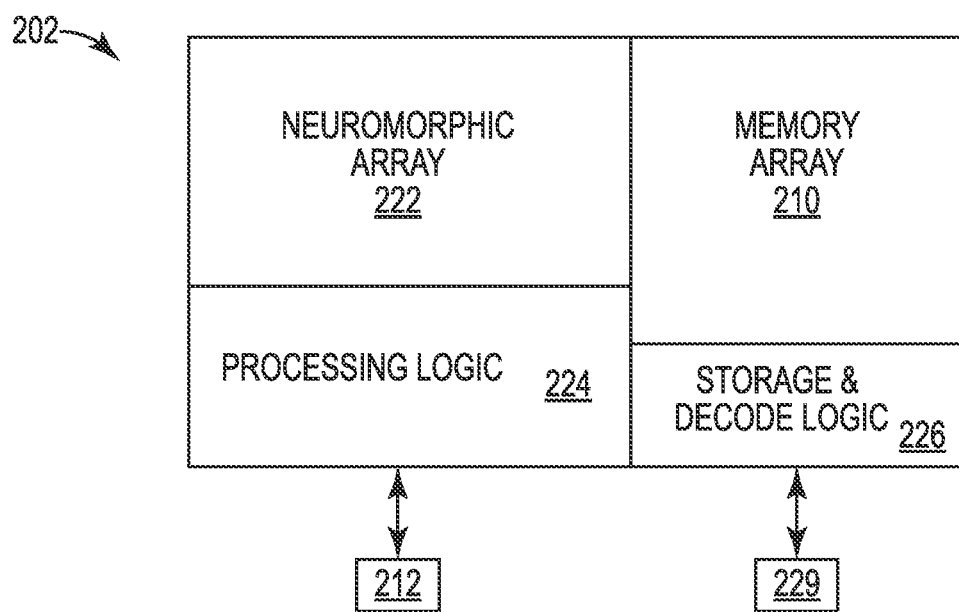
FIG. 2 is a block diagram of a dual-port, dual-function memory device including a neuromorphic array in accordance with a number of embodiments of the present disclosure.

FIG. 2 is a block diagram of a dual-port, dual-function memory device 202 (hereinafter referred to as the memory device 202) including a neuromorphic array 222 in accordance with a number of embodiments of the present disclosure. The neuromorphic array 222, memory array 210, port 212, and port 229 can be analogous to the neuromorphic array 122, memory array 110, port 112, and port 129, respectively, described in association with FIG. 1. For clarity and ease of description, the illustration of the memory device 202 in FIG. 2 has been simplified, relative to the illustration the memory device 102 in FIG. 1, to focus on features with particular relevance to the present disclosure.

FIG. 2 illustrates the dual functionality as well as the dual ports of the memory device 202. The dual functionality refers to the storage capability of the memory device 202 provided by the memory array 210 and the processing capability of the memory device 202 provided by the neuromorphic array 222. The memory device 202 includes the port 212 dedicated for communication between a host device (not shown), such as the host device 101 described in association with FIG. 1, and the neuromorphic array 222. The port 212 can be coupled to or include processing logic 224 of the memory device 202. The processing logic 224 can, for example, assist communication of instructions from the host device to the neuromorphic array 222 and responses from the neuromorphic array 222 to the host device.

The memory device 202 includes the port 229 for communication of data from a host device to the memory array 210 and/or communication of data from the memory array 210 to the host device. The port 229 can be referred as a data port of the memory device 202. The port 229 can be coupled to or include storage and decode logic 226 of the memory device 202. The storage and decode logic 226 can assist communication between the memory array 210 and the host device. The storage and decode logic 226 can provide an artificial neural network (ANN) model to the neuromorphic array 222. In a number of embodiments, the storage and decode logic 226 can represent respective functionalities of one or more of the following components described in association with FIG. 1: the address circuitry 104, the I/O circuitry 109, the row decoder 105, the write circuitry 108, the column decoder 107, the controller 103, and the sensing circuitry 106.

The neuromorphic array 222 can be coupled to the memory array 210 via a high-bandwidth connection, such as a serial interface. The neuromorphic array 222 can include local memory configured to store data received from the memory array 210 on which an operation is to be performed. The neuromorphic array 222 can serve as an AI accelerator, a co-processor, and/or a pre-processor. The neuromorphic array 222 can be configured to perform multiply and accumulate (MAC) operations on data received from the memory array 210.

The memory device 202 can be a component of a personal laptop computer, a desktop computer, a digital camera, a mobile telephone, an IoT enabled device, or a vehicle (e.g., an autonomous vehicle), among various other types of systems. In at least one embodiment, the memory device 202 can be a component of an event recorder of a vehicle, such as an autonomous vehicle. An event recorder may also be referred to as a black box.

Figure 3:
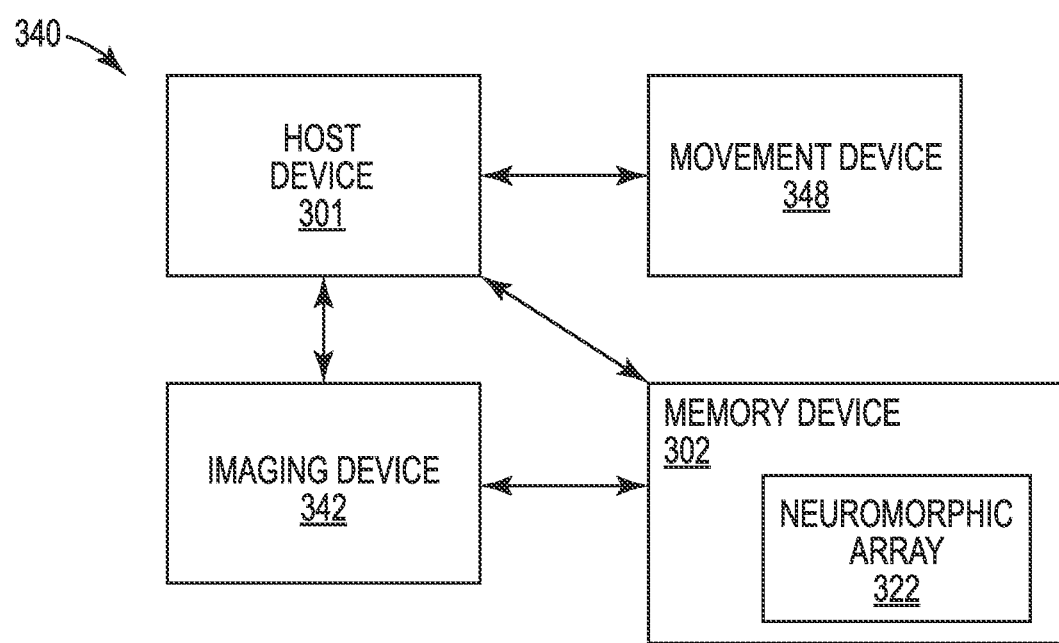
FIG. 3 is a block diagram of a system including a dual-port, dual-function memory device including a neuromorphic array in accordance with a number of embodiments of the present disclosure.

The memory device 202 can provide main memory or be used as additional memory or storage for a system, such the system 100 or the system 340 described in association with FIGS. 1 and 3, respectively. By way of example, the memory device 202 can be a dual in-line memory module (DIMM) operated as double data rate (DDR) DRAM, such as DDR5, a graphics DDR DRAM, such as GDDR6, or another type of memory system. Embodiments are not limited to a particular type of memory device. Other examples can include RAM, ROM, SDRAM, PCRAM, RRAM, flash memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

FIG. 3 is a block diagram of a system 340 including a dual-port, dual-function memory device 302 (hereinafter referred to as the memory device 302) including a neuromorphic array 322 in accordance with a number of embodiments of the present disclosure. The memory device 302 and neuromorphic array 322 can be analogous to the memory device 202 and neuromorphic array 222 described in association with FIG. 2.

The system 340 includes an imaging device 342 coupled to the memory device 302. The imaging device 342 can include an image sensor. Non-limiting examples of the imaging device include a camera and a light detecting and ranging (LiDAR) device. Data from the imaging device 342 can be written to the memory device 302. The memory device 302 can be coupled to an imaging device 342 via a port of the memory device 302, via the port 229, for example, described in association with FIG. 2.

The system 340 includes a host device 301. The host device 301 is coupled to the imaging device 342 and the memory device 302. The host device 101 described in association with FIG. 1 can represent the host device 301 and the imaging device 342. The host device 301 can provide instructions to the imaging device 342 regarding images captured by the imaging device 342, for example. The double-headed arrow between the host device 301 and the memory device 302 can represent the port 129 described in association with FIG. 1. The double-headed arrow between the imaging device 342 and the memory device 302 can represent the port 112 described in association with FIG. 1. The host device 301 can provide, via the port 212 described in association with FIG. 2, instructions to the memory device 302 regarding image processing operations to be performed, by the neuromorphic array 322. The image processing operations can be performed on data, received from the imaging device 342 and written to the memory device 302. The memory device 302 can be configured to provide signaling indicative of completion of image processing operations to the host device 301 via the port 112.

The system 340 includes a movement device 348. As used herein, "movement device" refers to a component of a system configured to alter movement of the system by affecting at least one of a speed, a direction, an altitude, a depth, an orientation, or a course of the system. Non-limiting examples of a movement device include a motor, a controller, and an actuator. In at least one embodiment, the system 340 can be a robotic system, an autonomous drone, and/or an autonomous vehicle. As used herein, "drone" refers to a device and/or system that cannot transport a human being whereas "vehicle" refers to a device and/or system that can transport a human being. The movement device 348 can be coupled to the host device 301. The host device 301 can be configured to direct activation of the movement device 348 to alter a movement of the system 340 based on results of image processing operations performed by the neuromorphic array 322.

Figure 4:
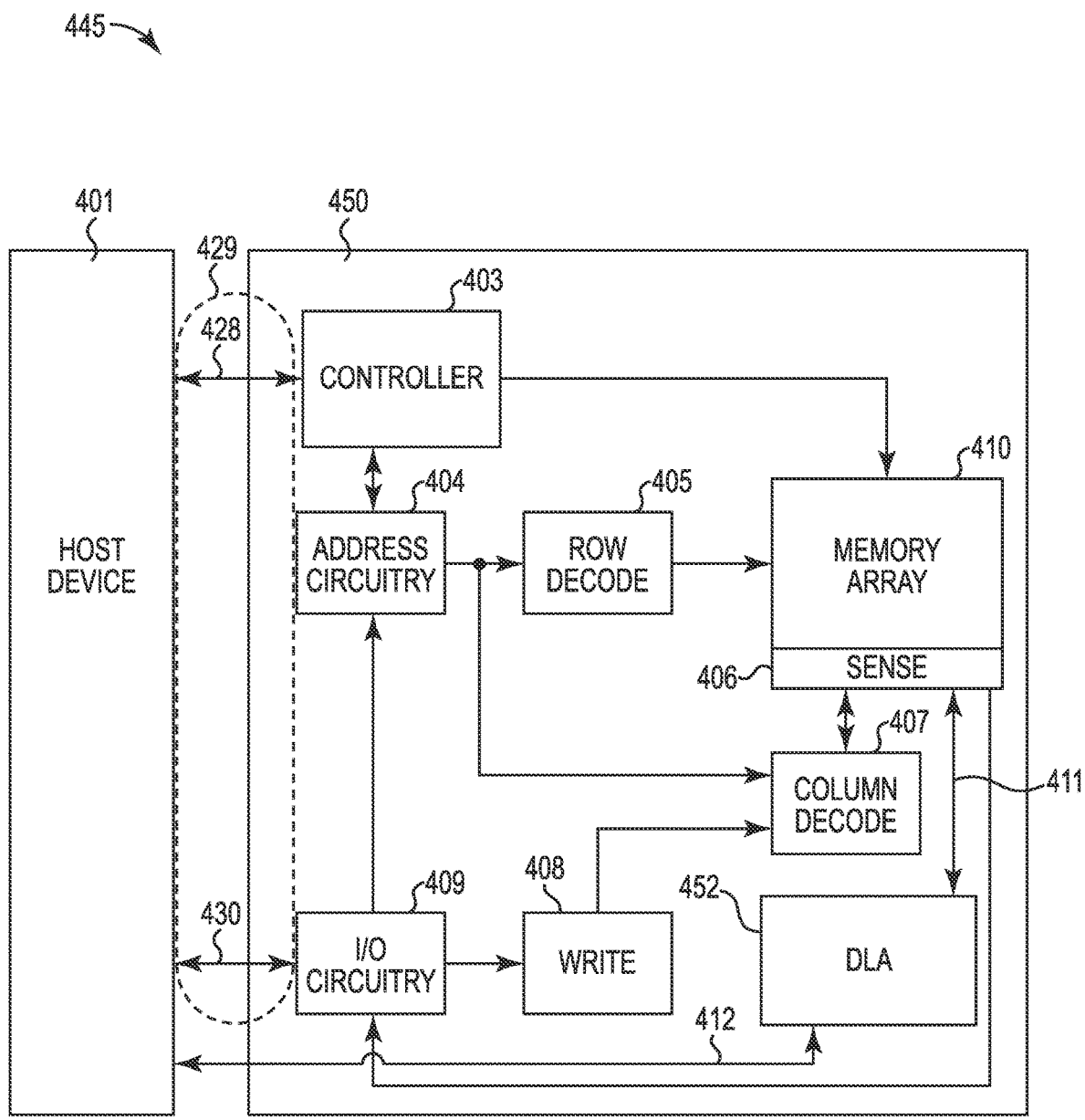
FIG. 4 is a block diagram of an apparatus in the form of a system including a dual-port, dual-function memory device including a deep learning accelerator (DLA) in accordance with a number of embodiments of the present disclosure.

FIG. 4 is a block diagram of an apparatus in the form of a system 445 including a dual-port, dual-function memory device 450 (hereinafter referred to as the memory device 450) in accordance with a number of embodiments of the present disclosure. As used herein, a memory device 450, a controller 403, a memory array 410, sensing circuitry 106, and/or an DLA 452 might also be separately considered an "apparatus." The host device 401, port 412, port 429, controller 403, address circuitry 404, I/O circuitry 409, row decoder 405, write circuitry 408, memory array 410, sensing circuitry 406, and column decoder 407 can be analogous to the host device 101, port 112, port 129, controller 103, address circuitry 104, I/O circuitry 109, row decoder 105, write circuitry 108, memory array 110, sensing circuitry 106, and column decoder 107, respectively, described in association with FIG. 1. Although not specifically illustrated as such, in at least one embodiment, the host device 401 can represent multiple distinct devices, such as an imaging device coupled to the memory device 450 as well as a host device coupled to the memory device 450.

The system 445 differs from the system 100 described in association with FIG. 1 in that the memory device 450 includes a DLA 452 as AI circuitry instead of a neuromorphic array. The memory device 450 includes the DLA 452. The DLA 452 can be configured to perform matrix operations associated with image processing operations on matrix operands. Matrix operands can be written to the memory array 410. In at least one embodiment, the memory array 410 can be an SSD. The DLA 452 can perform matrix operations on matrix operands received from the memory array 410. As represented by the double-headed arrow 411, the DLA 452 can have direct access to the memory array 410. The double-headed arrow 411 can represent a high-bandwidth interface between the DLA 452 and the memory array 410. The high-bandwidth interface can include at least an I/O (data) bus, an address bus, and a control bus, for example, dedicated for communication between the memory device 410 and the DLA 452. A non-limiting example of an internal high-bandwidth interface can be a DRAM DDR interface. In at least one embodiment, the memory array 410 can be coupled to the DLA 452 such that the high-bandwidth interface is external, such as a PCIe interface.

As illustrated by FIG. 4, the memory device 450 can be a dual-port memory device. The control bus 428 and the I/O bus 430 can be referred to, collectively, as a port 429 of the memory device 450. The memory device 450 can include the port 412 dedicated for communication between the host device 401 and the DLA 452. Although the port 412 is illustrated more generically than the port 429, the port 412 can include, for example, a connection to the I/O circuitry 409 or other I/O circuitry (not specifically illustrated). The port 412 can include at least an I/O bus and a control bus, similar to the control bus 428 and the I/O bus 430, for example, dedicated for communication between the host device 401 and the DLA 452. For example, the port 412 can be used for communication of instructions from the host device 401 to the DLA 452 and responses from the DLA 452 to the host device 401. The port 412 can be, but is not limited to, a MIPI, a PCIe interface, a CXL interface, or a low-power double data rate interface, such as LPDDR5. In a number of embodiments, the port 412 can be a separate and distinct physical interface of the memory device 450. The host device 401 can communicate instructions to perform an image processing operation to the DLA 452 via the port 412. The DLA 452 can indicate completion of operations (e.g., image processing operations) performed by the DLA 452 to the host device 401 via the port 412. As described above, in at least one embodiment, the host device 401 represents more than one distinct device in which the port 429 represents an interface for a first host device (e.g., an imaging device) and the port 412 represents an interface for a second host device (e.g., a computing device).

Figure 5:
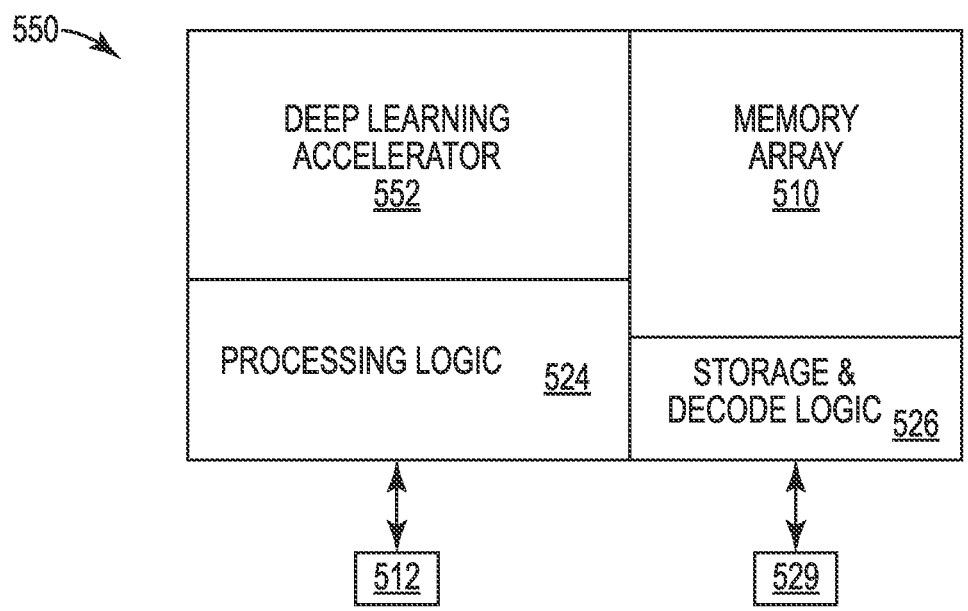
FIG. 5 is a block diagram of a dual port, dual function memory device including an DLA in accordance with a number of embodiments of the present disclosure.

FIG. 5 is a block diagram of a dual-port, dual-function memory device 550 (hereinafter referred to as the memory device 550) including an DLA 552 in accordance with a number of embodiments of the present disclosure. The DLA 552, memory array 510, port 512, and port 529 can be analogous to the DLA 452, memory array 410, port 412, and port 429, respectively, described in association with FIG. 4. For clarity and ease of description, the illustration of the memory device 550 in FIG. 5 has been simplified, relative to the illustration the memory device 450 in FIG. 4, to focus on features with particular relevance to the present disclosure.

FIG. 5 illustrates the dual functionality as well as the dual ports of the memory device 550. The dual functionality refers to the storage capability of the memory device 550 provided by the memory array 510 and the processing capability of the memory device 550 provided by the DLA 552. The memory device 550 includes the port 512 dedicated for communication between a host device (not shown), such as the host device 401 described in association with FIG. 4) and the DLA 552. For example, the port 412 can be dedicated for communication between a host device and the DLA 452 and/or communication of responses from the DLA 452 to the host device. The port 512 can be coupled to or include processing logic 524 of the memory device 550. The processing logic 524 can assist communication of instructions from the host device to the DLA 552 and responses from the DLA 552 to the host device.

The memory device 550 includes the port 529 for communication of data from a host device to the memory array 510 and/or communication of data from the memory array 510 to the host device. The port 529 can be coupled to or include storage and decode logic 526 of the memory device 550. The storage and decode logic 526 can assist communication between the memory array 510 and the host device. The storage and decode logic 526 can provide an artificial neural network (ANN) model to the DLA 552. In a number of embodiments, the storage and decode logic 526 can represent respective functionalities of one or more of the following components described in association with FIG. 4: the address circuitry 404, the I/O circuitry 409, the row decoder 405, the write circuitry 408, the column decoder 407, the controller 403, and the sensing circuitry 406.

The DLA 552 can be coupled to the memory array 510 via a high-bandwidth connection, such as a serial interface. The DLA 552 can include local memory configured to store matrix operands received from the memory array 510 on which an operation is to be performed. The DLA 552 can serve as an AI accelerator, a co-processor, and/or a pre-processor. The DLA 552 can be configured to perform MAC operations on matrix operands received from the memory array 510.

The memory device 550 can be a component of a personal laptop computer, a desktop computer, a digital camera, a mobile telephone, an IoT enabled device, or a vehicle (e.g., an autonomous vehicle), among various other types of systems. In at least one embodiment, the memory device 550 can be a component of an event recorder of a vehicle, such as an autonomous vehicle. An event recorder may also be referred to as a black box.

Figure 6:
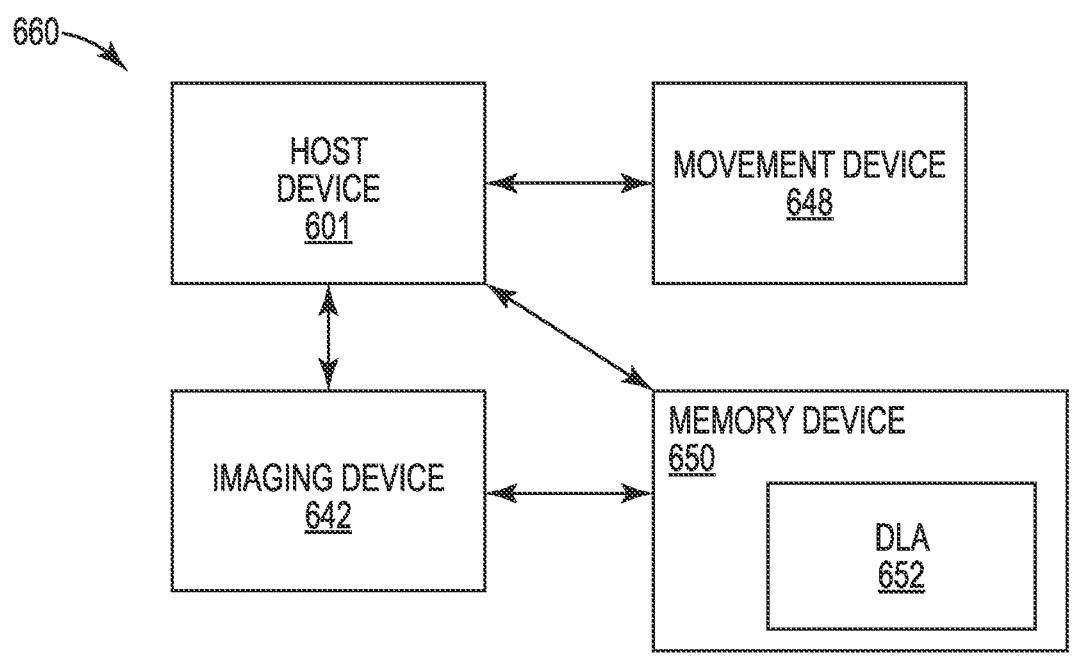
FIG. 6 is a block diagram of a system including a dual-port, dual-function memory device including an DLA in accordance with a number of embodiments of the present disclosure.

The memory device 550 can provide main memory or be used as additional memory or storage for a system, such the system 445 or the system 660 described in association with FIGS. 4 and 6, respectively. By way of example, the memory device 550 can be a DIMM operated as DDR DRAM, such as DDR5, a graphics DDR DRAM, such as GDDR6, or another type of memory system. Embodiments are not limited to a particular type of memory device. Other examples can include RAM, ROM, SDRAM, PCRAM, RRAM, flash memory, and three-dimensional cross-point, among others. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

FIG. 6 is a block diagram of a system 660 including a dual-port, dual-function memory device 650 including an DLA 652 in accordance with a number of embodiments of the present disclosure. The memory device 650 and DLA 652 can be analogous to the memory device 550 and DLA 552 described in association with FIG. 5.

The system 660 includes an imaging device 642 coupled to the memory device 650. The imaging device 642 can include an image sensor. Non-limiting examples of an imaging device include a camera and a LiDAR device. Data from the imaging device 642 can be written to the memory device 650.

The system 660 includes a host device 601. The host device 601 is coupled to the imaging device 642 and the memory device 650. The host device 646 and the imaging device 642 are represented by the host device 401 described in association with FIG. 4. The host device 601 can provide instructions to the imaging device 642 regarding images captured by the imaging device 642, for example. The double-headed arrow between the host device 601 and the memory device 650 can represent the port 3429 described in association with FIG. 4. The double-headed arrow between the imaging device 642 and the memory device 650 can represent the port 112 described in association with FIG. 1. The host device 601 can provide, via the port 512 described in association with FIG. 5, instructions to the memory device 650 regarding image processing operations to be performed, by the DLA 652, on matrix operands, from the imaging device 642, written to the memory device 650. The memory device 650 can be configured to provide, via the port 512, signaling to the host device 601 indicative of completion of image processing operations to the host device 601 via the port 512.

The system 660 includes a movement device 648. Non-limiting examples of a movement device include a motor, a controller, and an actuator. In at least one embodiment, the system 660 can be a robotic system, an autonomous drone, and/or an autonomous vehicle. The movement device 648 can be coupled to the host device 601. The host device 601 can be configured to direct activation of the movement device 648 to alter a movement of the system 660 based on results of image processing operations performed by the DLA 652.

Figure 7:
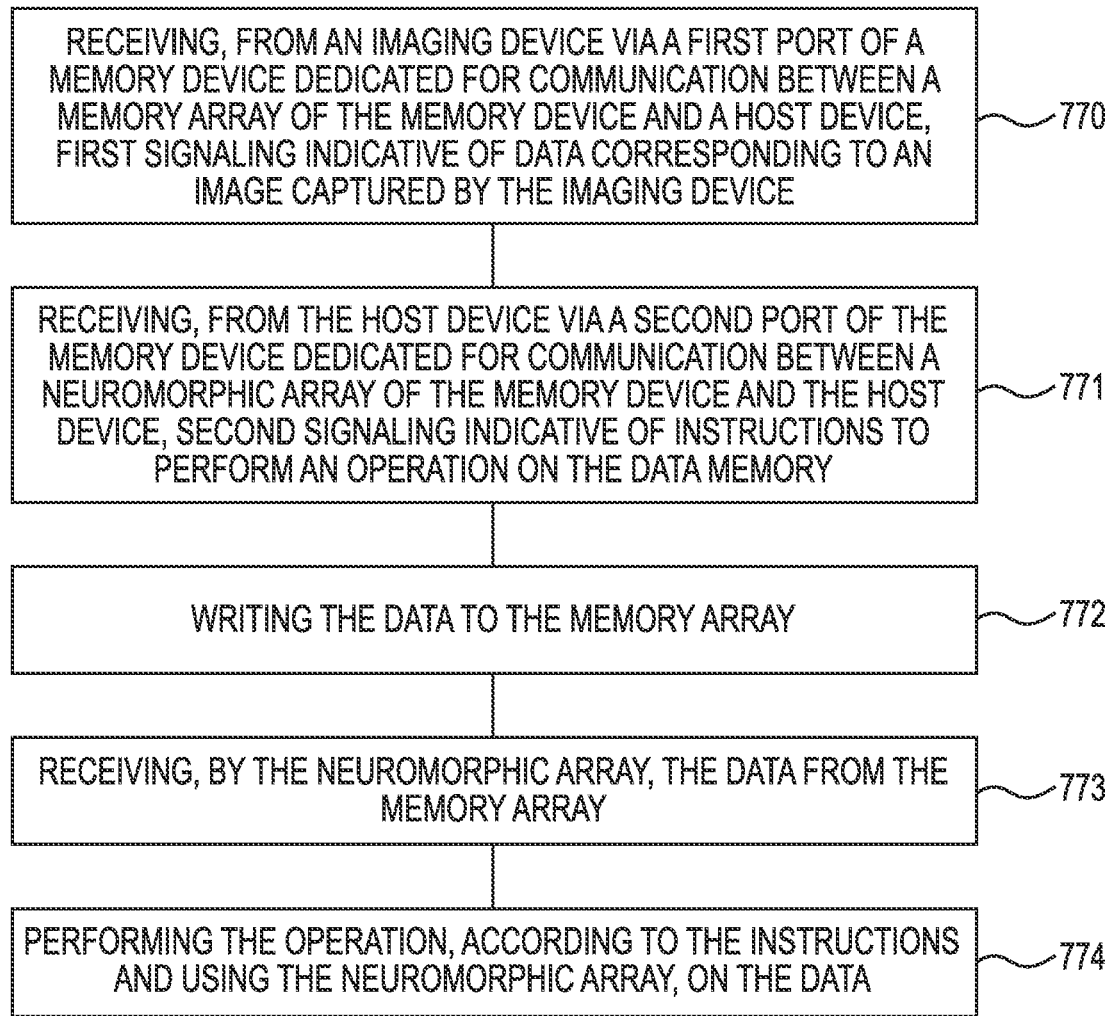
FIG. 7 is a flow diagram illustrating a method for performing an operation using a neuromorphic array of a dual-port, dual-function memory device in accordance with a number of embodiments of the present disclosure.

FIG. 7 is a flow diagram illustrating a method for performing an operation using a neuromorphic array of a dual-port, dual-function memory device in accordance with a number of embodiments of the present disclosure. The method described in association with FIG. 7 can be performed by, for example, the memory device 102 described in association with FIG. 1.

At block 770, the method can include receiving, from an imaging device via a first port of a memory device, first signaling indicative of data corresponding to an image captured by the imaging device. The first port can be dedicated for communication between an array of memory cells of the memory device and a host device.

At block 771, the method can include receiving, from a host device via a second port of the memory device, second signaling indicative of instructions to perform an operation on the data. The second port can be dedicated for communication between a neuromorphic array of the memory device and the host device. The imaging device can be a LiDAR device. The first signaling can be received from the LiDAR device via the first port.

At block 772, the method can include writing the data to the array of memory cells. At block 773, the method can include receiving (e.g., retrieving directly), by the neuromorphic array, the data from the array of memory cells. At block 774, the method can include performing, by the neuromorphic array, the operation on the data according to the instructions. Performing the operation can include performing, by the neuromorphic array, a MAC operation on the data and communicating, by the neuromorphic array, a result of the operation from the neuromorphic array to the array of memory cells. Third signaling indicative of completion of the operation can be communicated to the host device via the second port. Performing the operation can include performing at least one of a compression operation; a frame buffer operation an encoding, decoding, or scaling operation; a color space conversion operation; and an attention finding operation.

Figure 8:
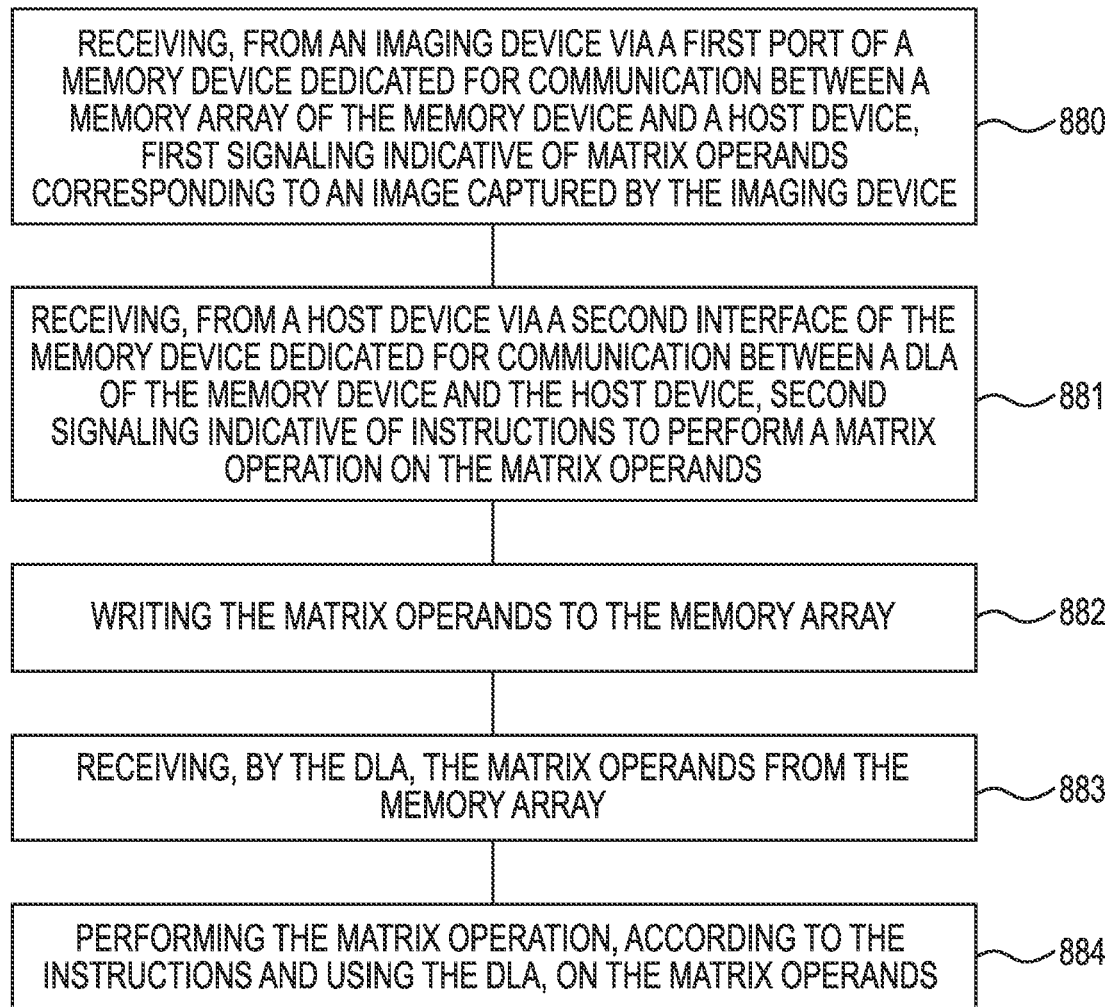
FIG. 8 is a flow diagram illustrating a method for performing an operation using an DLA of a dual-port, dual-function memory device in accordance with a number of embodiments of the present disclosure.

FIG. 8 is a flow diagram illustrating a method for performing a matrix operation using a DLA of a dual-port, dual-function memory device in accordance with a number of embodiments of the present disclosure. The method described in association with FIG. 8 can be performed by, for example, the memory device 450 described in association with FIG. 4.

At block 880, the method can include receiving, from an imaging device via a first port of a memory device, first signaling indicative of matrix operands corresponding to an image captured by the imaging device. The first port can be dedicated for communication between an array of memory cells of the memory device and a host device. The imaging device can be a LiDAR device. The LiDAR device, the memory device, and the host device can be components of an autonomous vehicle. The first signaling can be received from the LiDAR device via the first port.

At block 881, the method can include receiving, from a host device via a second port of the memory device, second signaling indicative of instructions to perform a matrix operation on the matrix operands. The second port can be dedicated for communication between a DLA of the memory device and the host device. The first signaling, the second signaling, and performing the matrix operation can be associated with navigating the autonomous vehicle.

At block 882, the method can include writing the matrix operands to the array of memory cells. At block 883, the method can include receiving (e.g., retrieving directly), by the DLA, the matrix operands from the array of memory cells. At block 884, the method can include performing, by the DLA, the matrix operation on the matrix operands according to the instructions, on the matrix operands using the DLA. Third signaling indicative of completion of the matrix operation can be communicated to the host device via the second port. Performing the matrix operation can include performing at least one of a compression operation; a frame buffer operation an encoding, decoding, or scaling operation; a color space conversion operation; and an attention finding operation.

Embodiments can include a tangible machine-readable storage medium (also known as a computer-readable medium) on which is stored one or more sets of instructions or software embodying any one or more of the methodologies or functions described herein. In some embodiments, a memory device or a processing device constitutes a machine-readable medium. The term "machine-readable storage medium" includes a single medium or multiple media that store the one or more sets of instructions. The term "machine-readable storage medium" includes any medium that is capable of storing or encoding a set of instructions for execution by the machine and that cause the machine to perform any one or more of the methodologies of the present disclosure. The term "machine-readable storage medium" includes, but is not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   receiving, from an imaging device via a first port of a memory device, first signaling indicative of data corresponding to an image captured by the imaging device;
   wherein the first port is dedicated for communication between an array of memory cells of the memory device and a host device;
   receiving, from the host device via a second port of the memory device, second signaling indicative of instructions to perform an operation on the data,
   wherein the second port is dedicated for communication between a neuromorphic array of the memory device and the host device;
   writing the data to the array of memory cells;
   receiving, by the neuromorphic array, the data from the array of memory cells; and
   performing, by the neuromorphic array, the operation on the data according to the instructions.

2. The method of claim 1, wherein performing the operation comprises:
   performing, by the neuromorphic array, a multiply and accumulate (MAC) operation on the data; and
   communicating, by the neuromorphic array, a result of the operation from the neuromorphic array to the array of memory cells.

3. The method of claim 1, wherein the imaging device comprises a light detecting and ranging (LiDAR) device, and
   wherein receiving the first signaling comprises receiving the first signaling from the LiDAR device via the first port.

4. The method of claim 1, further comprising communicating, to the host device via the second port, third signaling indicative of completion of the operation.

5. The method of claim 1, wherein performing the operation comprises performing at least one of:
   a compression operation;
   a frame buffer operation;
   an encoding, decoding, or scaling operation;
   a color space conversion operation; and
   an attention finding operation.

6. A method, comprising:
   receiving, from an imaging device via a first port of a memory device, first signaling indicative of matrix operands corresponding to an image captured by the imaging device,
   wherein the first port is dedicated for communication between an array of memory cells of the memory device and a host device;
   receiving, from the host device via a second port of the memory device, second signaling indicative of instructions to perform a matrix operation on the matrix operands,
   wherein the second port is dedicated for communication between a deep learning accelerator (DLA) of the memory device and the host device;
   writing the matrix operands to the array of memory cells;
   receiving, by the DLA, the matrix operands from the array of memory cells; and
   performing, by the DLA, the matrix operation on the matrix operands according to the instructions.

7. The method of claim 6, wherein the imaging device comprises a light detecting and ranging (LiDAR) device,
   wherein the LiDAR device, the memory device, and the host device are components of an autonomous vehicle,
   wherein receiving the first signaling comprises receiving the first signaling from the LiDAR device via the first port, and
   wherein the first signaling, the second signaling, and performing the matrix operation is associated with navigating the autonomous vehicle.

8. The method of claim 6, further comprising communicating, to the processing device via the second port, third signaling indicative of completion of the matrix operation.

9. The method of claim 6, wherein performing the matrix operation comprises performing at least one of:
   a compression operation;
   a frame buffer operation;
   an encoding, decoding, or scaling operation;
   a color space conversion operation; and
   an attention finding operation.

10. An apparatus, comprising:
    an array of memory cells;
    a first port coupled to the array of memory cells and configured to communicate first signaling indicative of data from a light detecting and ranging (LiDAR) device to the array of memory cells,
    wherein the first port is dedicated for communication between the LiDAR device and the array of memory cells;
    a second port coupled to a neuromorphic array and configured to communicate second signaling indicative of instructions to perform operations from a host device to the neuromorphic array,
    wherein the second port is dedicated for communication between the neuromorphic array and the host device; and
    the neuromorphic array coupled to the array of memory cells and configured to perform the operations on the data according to the instructions.

11. The apparatus of claim 10, wherein the neuromorphic array is further configured to:
    communicate third signaling indicative of a result of the operations to the array of memory cells,
    communicate fourth signaling indicative of completion of the operations to the host device via the second port.

12. The apparatus of claim 10, wherein the neuromorphic array is further configured to perform multiply and accumulate (MAC) operations.

13. The apparatus of claim 10, wherein the neuromorphic array is further configured to serve as an artificial intelligence (AI) accelerator.

14. The apparatus of claim 10, wherein the neuromorphic array is further configured to serve as a co-processor or a pre-processor.

15. The apparatus of claim 10, further comprising:
storage and decode logic coupled to the first port; and
processing logic coupled to the second port.

16. An apparatus, comprising:
an array of memory cells;
a first port coupled to the array of memory cells configured to communicate first signaling indicative of matrix operands from a light detecting and ranging (LiDAR) device to the array of memory cells,
wherein the first port is dedicated for communication between the LiDAR device and the array of memory cells;
a second port coupled to a deep learning accelerator (DLA) and configured to communicate second signaling indicative of instructions to perform matrix operations from a host device to the DLA,
wherein the second port is dedicated for communication between the host device and the DLA; and
the DLA coupled to the array of memory cells and configured to:
receive at least one of the matrix operands from the array of memory cells; and
perform the matrix operations on the received matrix operands.

17. The apparatus of claim 16, wherein the DLA is further configured to communicate third signaling indicative of completion of the matrix operations to the host device via the second port.

18. A system, comprising:
a host device;
an imaging device coupled to the host device;
a dual-port, dual-function memory device coupled to the imaging device and the host device, wherein the dual-port, dual-function memory device comprises:
an array of memory cells; and
a neuromorphic array coupled to the array of memory cells and configured to perform an operation on data received from to the array of memory cells;
a first port coupled to the array of memory cells and configured to:
communicate first signaling indicative of data from the imaging device to the array of memory cells; and
communicate second signaling indicative of a result of the operation from the array of memory cells to the host device,
wherein the first port is dedicated for communication between the imaging device and the array of memory cells and communication between the array of memory cells and the host device;
a second port coupled to the neuromorphic array and configured to:
communicate third signaling indicative of instructions to perform the operation from the host device to the neuromorphic array; and
communicate fourth signaling indicative of completion of the operation from the neuromorphic array to the host device,
wherein the second port is dedicated for communication between the host device and the neuromorphic array; and
a movement device coupled to the host device and configured to alter a movement of the system.

19. The system of claim 18, wherein the imaging device comprises a light detecting and ranging (LiDAR) device.

20. The system of claim 18, wherein the imaging device comprises an image sensor.

21. The system of claim 18, wherein the movement device comprises at least one of a motor, a controller, and an actuator.

22. The system of claim 18, wherein the array of memory cells comprises a solid state drive (SSD).

23. The system of claim 18, wherein the host device is further configured to direct activation of the movement device based at least in part on the result of the operation.

24. The system of claim 23, wherein the host device is further configured to direct navigation of the system via directing activation of the movement device.

* * * * *